United States Patent [19]
Chung

[11] Patent Number: 5,677,864
[45] Date of Patent: Oct. 14, 1997

[54] INTELLIGENT MEMORY ARCHITECTURE

[76] Inventor: David Siu Fu Chung, 58 Edgecliff Esplanade, Seaforth, NSW 2092, Australia

[21] Appl. No.: 525,627
[22] PCT Filed: Mar. 23, 1994
[86] PCT No.: PCT/AU94/00145
§ 371 Date: Jan. 23, 1996
§ 102(e) Date: Jan. 23, 1996
[87] PCT Pub. No.: WO94/22090
PCT Pub. Date: Sep. 29, 1994

[30] Foreign Application Priority Data

Mar. 23, 1993 [AU] Australia .................................. PL7941
Nov. 8, 1993 [AU] Australia .................................. PM2232

[51] Int. Cl.[6] ............................................. G06F 15/00
[52] U.S. Cl. ............... 365/63; 365/230.03; 365/230.06; 395/405
[58] Field of Search ........................ 365/230.05, 72, 365/230.01; 395/250, 800

[56] References Cited

U.S. PATENT DOCUMENTS 4,835,733  5/1989  Powell ................................ 364/900
5,134,711  7/1992  Asthana et al. ...................... 395/800
5,475,631  12/1995 Parkinson et al. ................... 395/800

FOREIGN PATENT DOCUMENTS

WO 90/00287  11/1990  WIPO .

*Primary Examiner*—Viet Q. Nguyen
*Attorney, Agent, or Firm*—Skjerven, Morrill, MacPherson, Franklin & Friel; Norman R. Klivans

[57] ABSTRACT

An intelligent memory device comprises a data module, an access module and an interface module and is configured to allow data manipulation to take place within the data module without the involvement of the host system. The memory module consists of a plurality of data storage elements each of which has an associated three port switch enabling data communication between the data storage elements without data having to tie up the data bus of the host system. The access module comprises a 1:N switch and a range decoder. The 1:N switch provides access between the host system data bus and the three port switches of the data module, while the range decoder decodes a range of addresses to be affected by an internal memory operation. The interface module comprises an instruction decoder and control logic and is responsive to an instruction sent to the intelligent memory device by the host system to control the operation of internal memory manipulations. Intelligent memory devices can be used to perform a variety of memory data manipulations of varying complexity, including summing, gating, searching and shifting. In the simplest form of intelligent memory device only two operations are provided, these being a shift up and a shift down, each of which causes the data in a range of contiguous memory locations to be shifted by one memory location in the given direction.

48 Claims, 17 Drawing Sheets

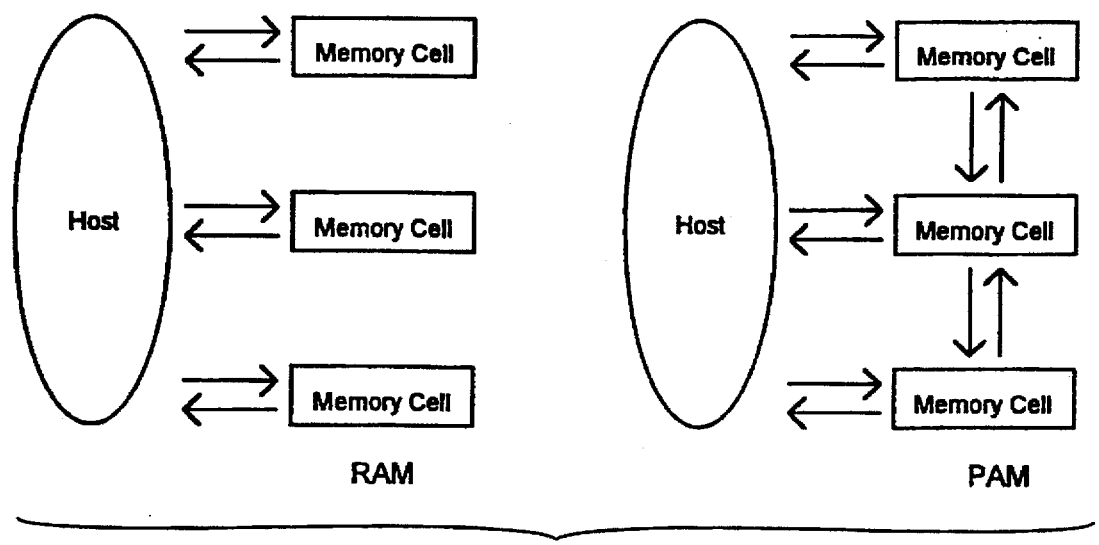
FIG. 5
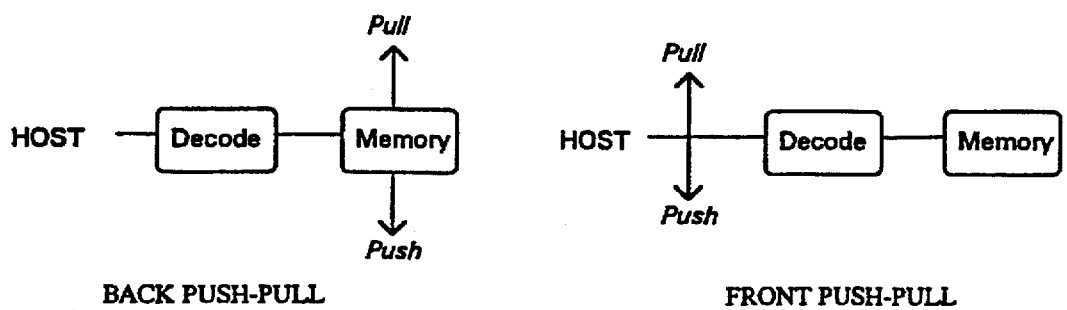
BACK PUSH-PULL
FRONT PUSH-PULL
FIG. 6
FIG. 7

*Memory Bank (M) = Data Storage (DS) + 3-port Switch (3S)*

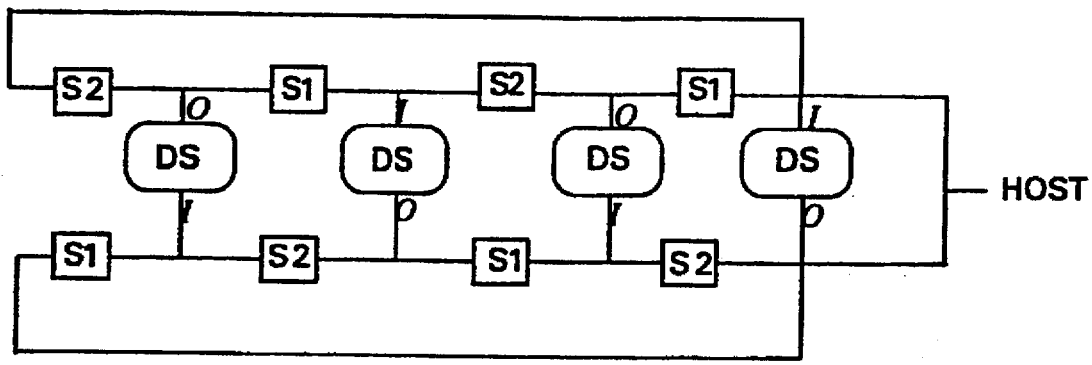
FIG. 16
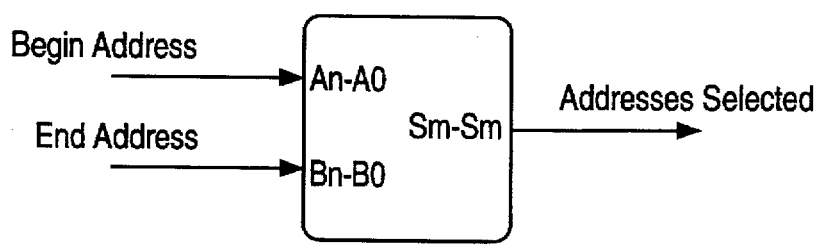
FIG. 17
| A1 | A0 | S3 | S2 | S1 | S0 |
|----|----|----|----|----|----|
| 0  | 0  | 0  | 0  | 0  | 1  |
| 0  | 1  | 0  | 0  | 1  | 0  |
| 1  | 0  | 0  | 1  | 0  | 0  |
| 1  | 1  | 1  | 0  | 0  | 0  |
FIG. 18

| A1 | A0 | B1 | B0 | S3 | S2 | S1 | S0 |
|----|----|----|----|----|----|----|----|
| 0 | 0 | 0 | 0 | 0 | 0 | 0 | 1 |
| 0 | 0 | 0 | 1 | 0 | 0 | 1 | 1 |
| 0 | 0 | 1 | 0 | 0 | 1 | 1 | 1 |
| 0 | 0 | 1 | 1 | 1 | 1 | 1 | 1 |
| 0 | 1 | 0 | 0 | 0 | 0 | 1 | 1 |
| 0 | 1 | 0 | 1 | 0 | 0 | 1 | 0 |
| 0 | 1 | 1 | 0 | 0 | 1 | 1 | 0 |
| 0 | 1 | 1 | 1 | 1 | 1 | 1 | 0 |
| 1 | 0 | 0 | 0 | 0 | 1 | 1 | 1 |
| 1 | 0 | 0 | 1 | 0 | 1 | 1 | 0 |
| 1 | 0 | 1 | 0 | 0 | 1 | 0 | 0 |
| 1 | 0 | 1 | 1 | 1 | 1 | 0 | 0 |
| 1 | 1 | 0 | 0 | 1 | 1 | 1 | 1 |
| 1 | 1 | 0 | 1 | 1 | 1 | 1 | 0 |
| 1 | 1 | 1 | 0 | 1 | 1 | 0 | 0 |
| 1 | 1 | 1 | 1 | 1 | 0 | 0 | 0 |

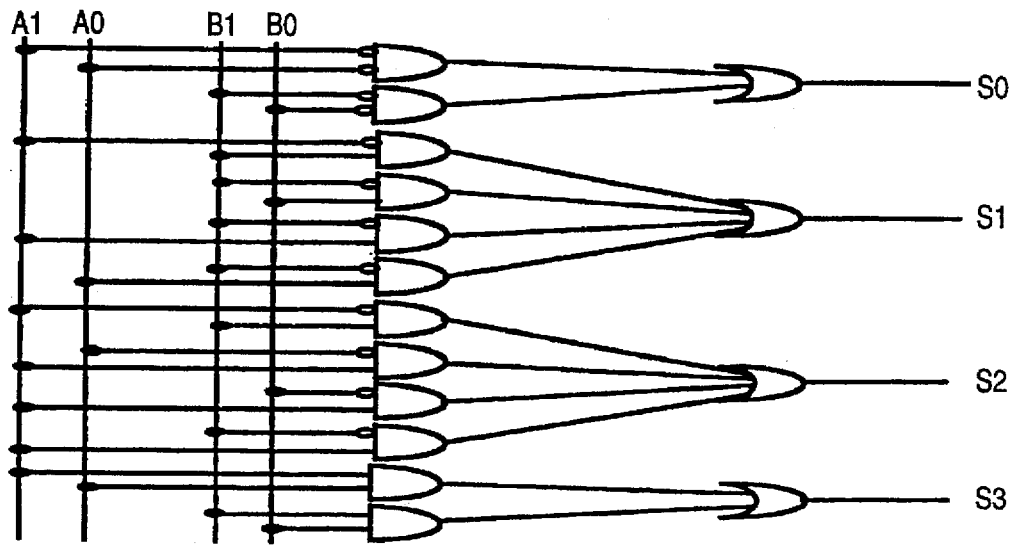
FIG. 21
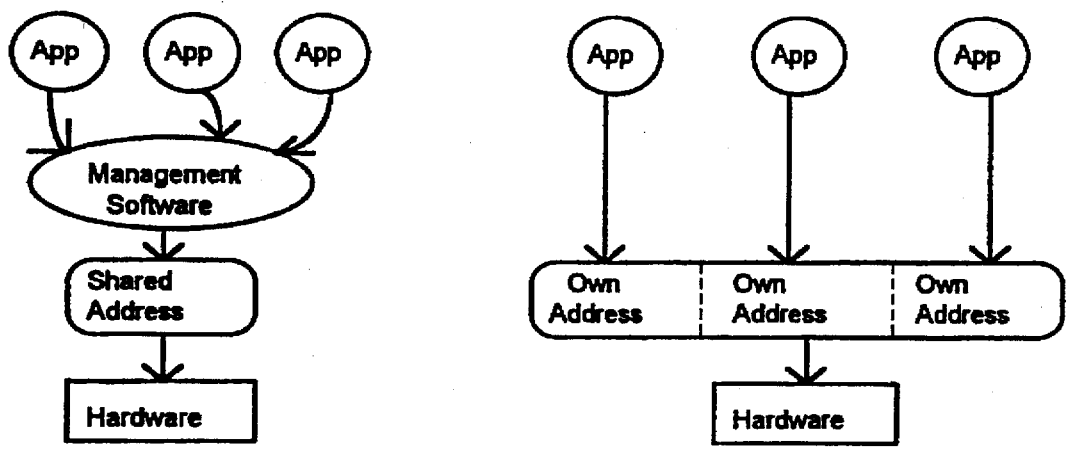
FIG. 22  FIG. 23

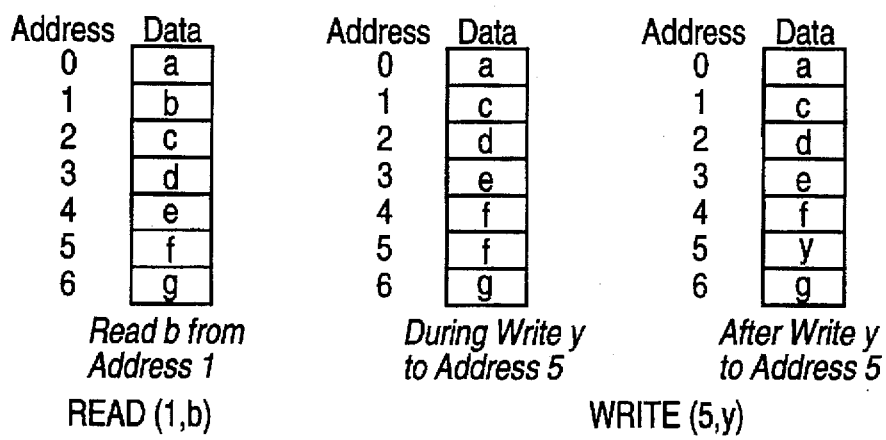
FIG. 29
| ACCESS CYCLE SEQUENCE | OPERATION |
| --- | --- |
| Read (*addr1*) after Read (*addr2*) | Standard memory read from *addr1* |
| Read (*addr1*) after Write (*addr2*) | Standard memory read from *addr1* |
| Write (*addr1*) after Read (*addr2*) | Shift data words from *addr1* towards *addr2* |
| Write (*addr1*) after Write (*addr2*) | Standard memory write to *addr1* |
FIG. 30
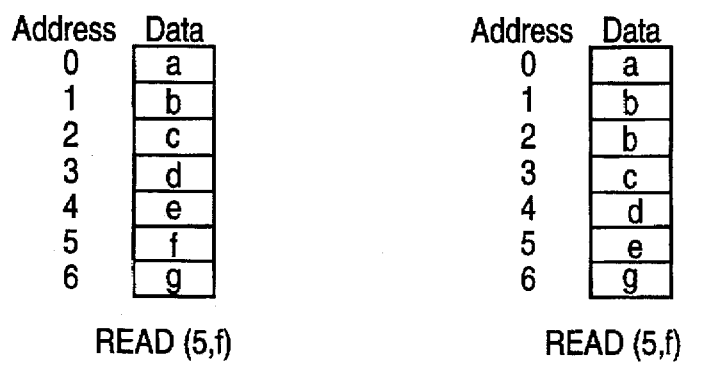
FIG. 31

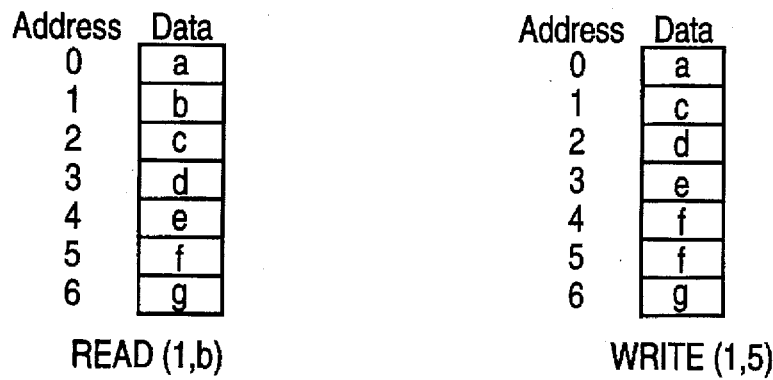
FIG. 32
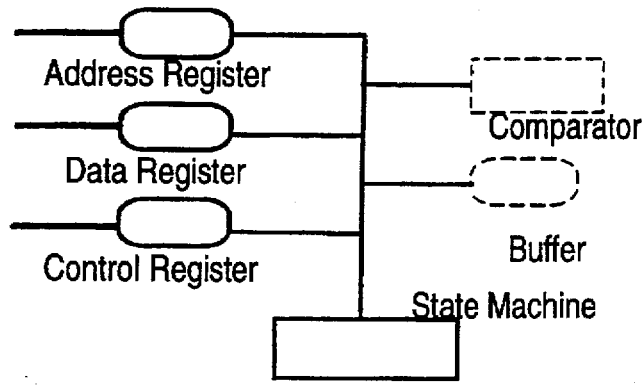
FIG. 33
| Address Magnitudes | Operation / Status | Control Signal |
|---|---|---|
| A = B | Host Access | 00 |
| A > B | Push Down | 01 |
| A < B | Pull Up | 10 |
| Idle | Data Hold | 11 |
FIG. 34

| A1 | A0 | B1 | B0 | S3 | S2 | S1 | S0 |
|----|----|----|----|----|----|----|----|
| 0 | 0 | 0 | 0 | 11 | 11 | 11 | 00 |
| 0 | 0 | 0 | 1 | 11 | 11 | 10 | 10 |
| 0 | 0 | 1 | 0 | 11 | 10 | 10 | 10 |
| 0 | 0 | 1 | 1 | 10 | 10 | 10 | 10 |
| 0 | 1 | 0 | 0 | 11 | 11 | 01 | 01 |
| 0 | 1 | 0 | 1 | 11 | 11 | 00 | 11 |
| 0 | 1 | 1 | 0 | 11 | 10 | 10 | 11 |
| 0 | 1 | 1 | 1 | 10 | 10 | 10 | 11 |
| 1 | 0 | 0 | 0 | 11 | 01 | 01 | 01 |
| 1 | 0 | 0 | 1 | 11 | 01 | 01 | 11 |
| 1 | 0 | 1 | 0 | 11 | 00 | 11 | 11 |
| 1 | 0 | 1 | 1 | 10 | 10 | 11 | 11 |
| 1 | 1 | 0 | 0 | 01 | 01 | 01 | 01 |
| 1 | 1 | 0 | 1 | 01 | 01 | 01 | 11 |
| 1 | 1 | 1 | 0 | 01 | 01 | 11 | 11 |
| 1 | 1 | 1 | 1 | 00 | 11 | 11 | 11 |

FIG. 35

INTELLIGENT MEMORY ARCHITECTURE

1. INTRODUCTION

The present invention relates to improvements in Intelligent Memory Devices (IMDs). Intelligent Memory Devices are memory devices capable of performing other functions independently of the host processor, in addition to storage of data. Besides standard read and write commands, they might support functions like shifting, adding, and searching of data held in their memory.

According to a first aspect, the present invention consists in a memory module for storing data, and having a memory array organised as a plurality of contiguous data word storage elements, an access system arranged to provide a plurality of access modes to the memory array, and an interface system arranged to interpret access requests delivered to the module via address, data and control lines and to provide control signals to the access system to select the required access mode, to provide address information to select the storage element or elements to be accessed, and to provide access to the selected storage element or elements, the interface and access systems being arranged to provide conventional read/write access to the memory array in response to a conventional read/write request to the memory module and to provide additional access modes which allow data to be operated on within the memory module independently of a host system to which the memory module is connected.

According to a second aspect the present invention consists in an address range decoding device for controlling selection of a range of addresses in a storage array, comprising first and second address input means, decoding logic means and a plurality of address selection outputs, there being one output for each address in the storage array, the address range decoding means being arranged to accept starting and ending address codes as said first and second address inputs respectively and the decoding logic being arranged to activate those outputs corresponding to the first and second input addresses and each address between the first and second input addresses to facilitate an operation on the data in the range of storage locations bounded by the starting and ending addresses.

According to a third aspect the present invention consists in an instruction decoding device for decoding a memory operation instruction, comprising address input means, read/write control signal input means, instruction decoding logic and one or more outputs arranged to indicate a data operation to which the instruction relates, the instruction decoding logic being arranged to set the one or more outputs depending upon relative values of the address and control signals presented to the input means.

According to a fourth aspect the present invention consists in an instruction decoding device for decoding an instruction indicating an operation to be performed on data in a storage array having a plurality of contiguous addressable storage locations, the device comprising first and second address input means, read/write control signal input means, instruction decoding logic, address range decoding logic, one or more instruction outputs arranged to indicate the operation to be performed and a plurality of address selection outputs, the instruction decoding logic being arranged to compare the first and second addresses and respective read/write control signals and to set the one or more instruction outputs depending upon the relative values of the address and control signals, the address range decoding logic being arranged to control the plurality of address selection outputs, there being one address selection output for each address in the storage array, the address range decoding logic being arranged to accept starting end ending address codes as said first and second address inputs and to activate those address selection outputs corresponding to the first and second input addresses and each address between the first and second input addresses to select a range of storage locations bounded by the starting and ending addresses which contain the data upon which the operation is to be performed.

In various embodiments of the invention the interface system decodes information provided via the address, data and/or control lines of the module to determine the starting and ending address of the data to be operated on and the form of operation to be performed.

This may be achieved by writing a predetermined data word to a storage location within the address space of the memory module, by performing an access to a predetermined address or an address within a predetermined range of address, or by a predetermined sequence of control signals.

In a preferred embodiment the operation instruction is indicated by a predetermined sequence of control signals which correspond to a read operation within the address space of the memory module, followed by a write operation within the same address space. Preferably, in this embodiment the ending address of the data to be operated on is given by the address specified in said read operation and the starting address of the data to be operated on is given by the address specified in said write operation.

Preferably, in embodiments of the invention the memory would provide conventional read/write functionality and therefore the read operation of the abovementioned embodiment would be functionally equivalent to a conventional read operation on the memory array and the write operation would be functionally equivalent to a conventional write operation on the memory array, but wherein the write operation function would be delayed until after the data from the storage element at starting address had been operated on.

2. BRIEF DESCRIPTION OF THE DRAWINGS

Embodiments of the invention will now be described in further detail with reference to the accompanying drawings in which:

FIG. 5 is a block schematic illustrating the differences between a standard RAM and a Range Shifting Memory (RSM);

Figure 8:
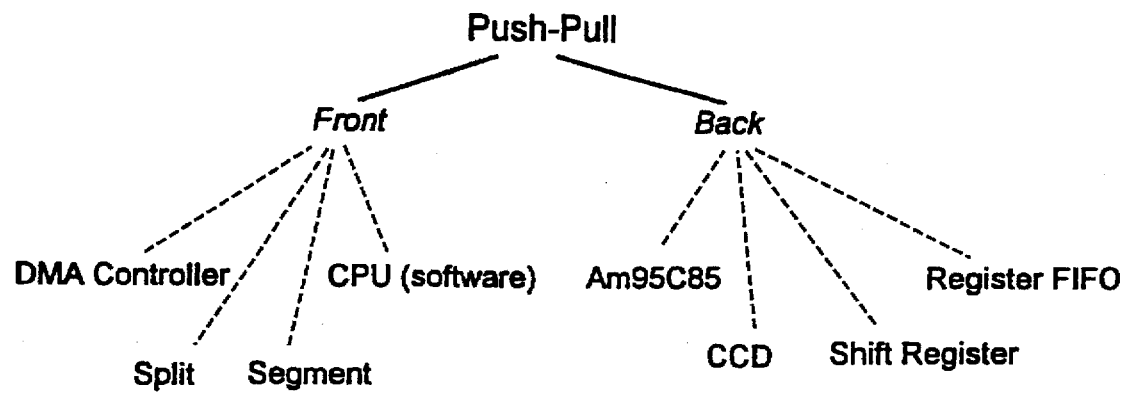
Figure 9:
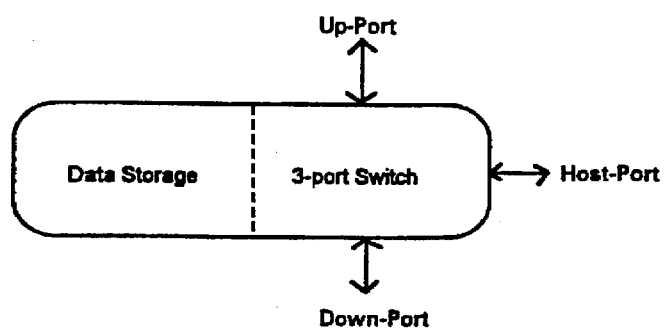
Figure 10:
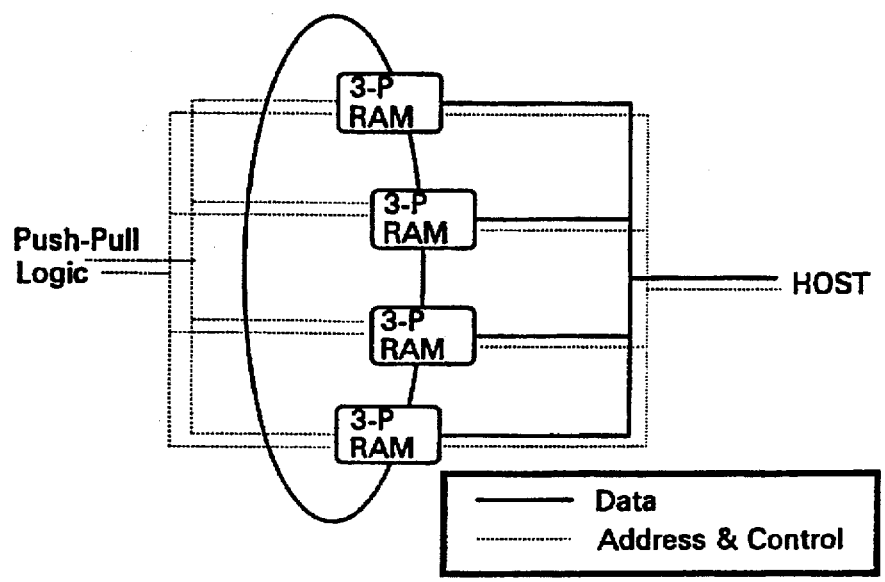
Figure 11:
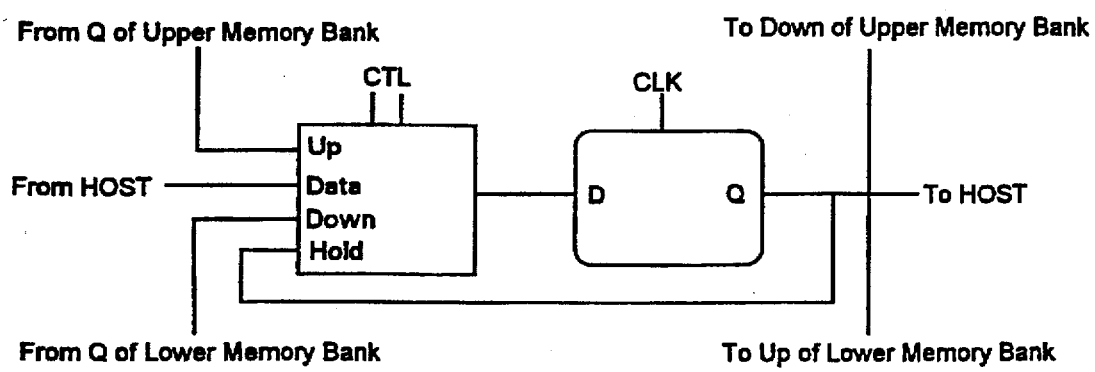
Figure 12:
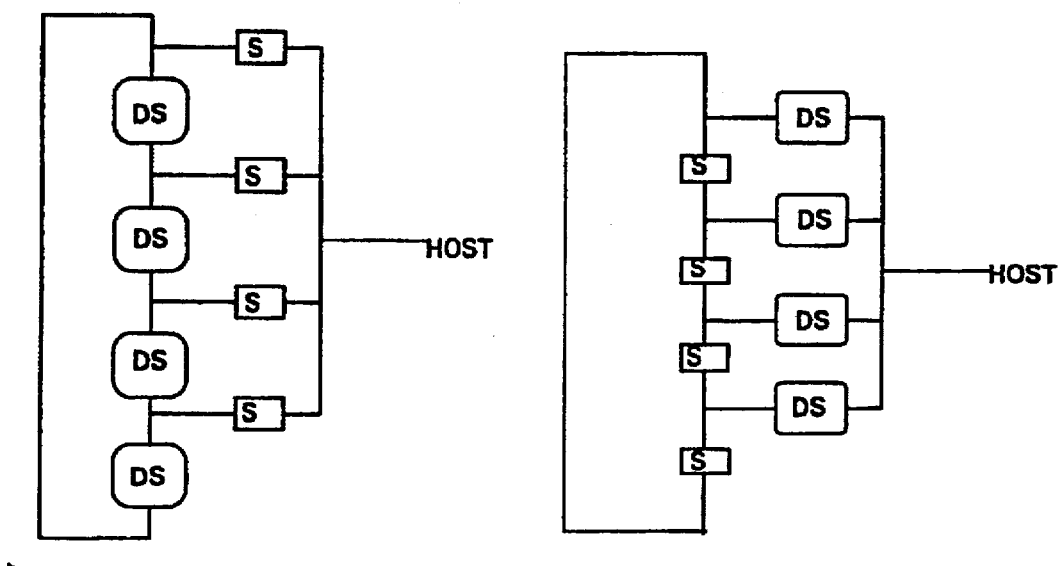
Figure 13:
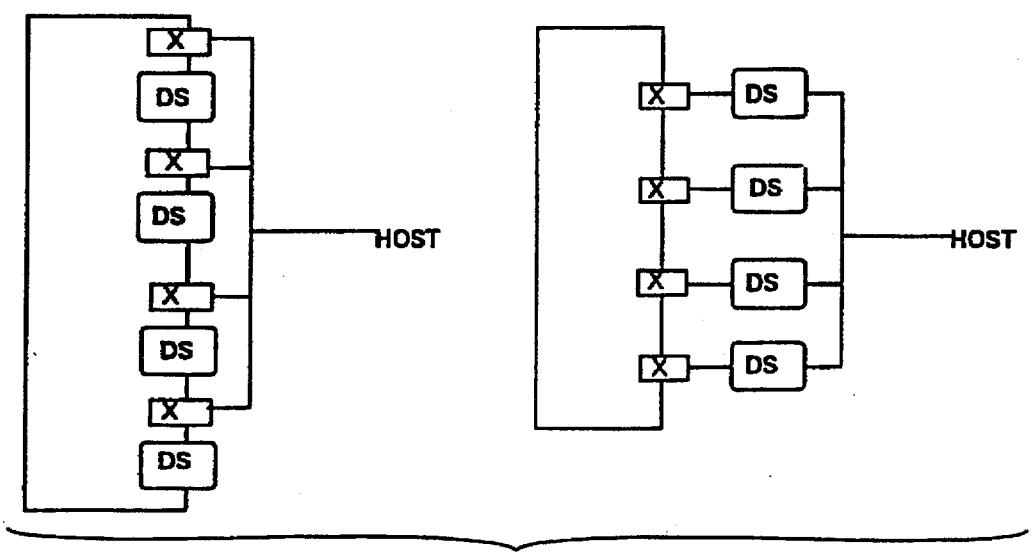
Figure 14:
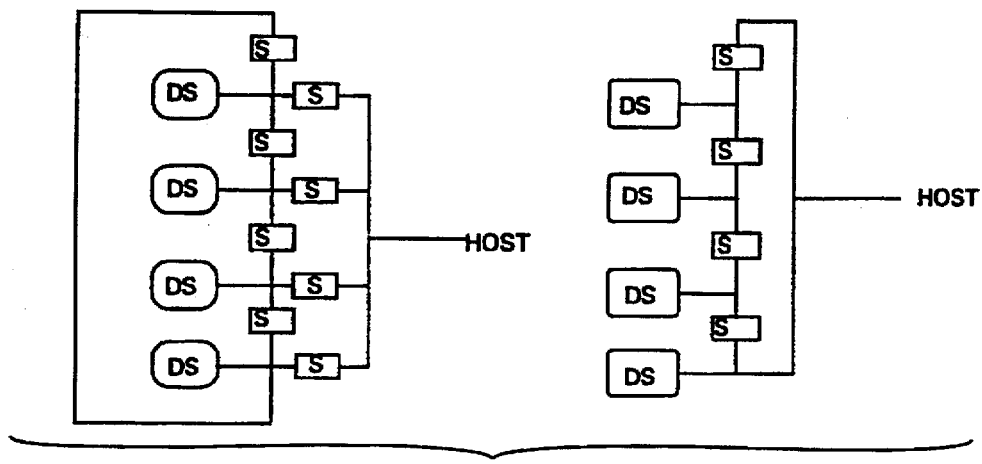
Figure 15:
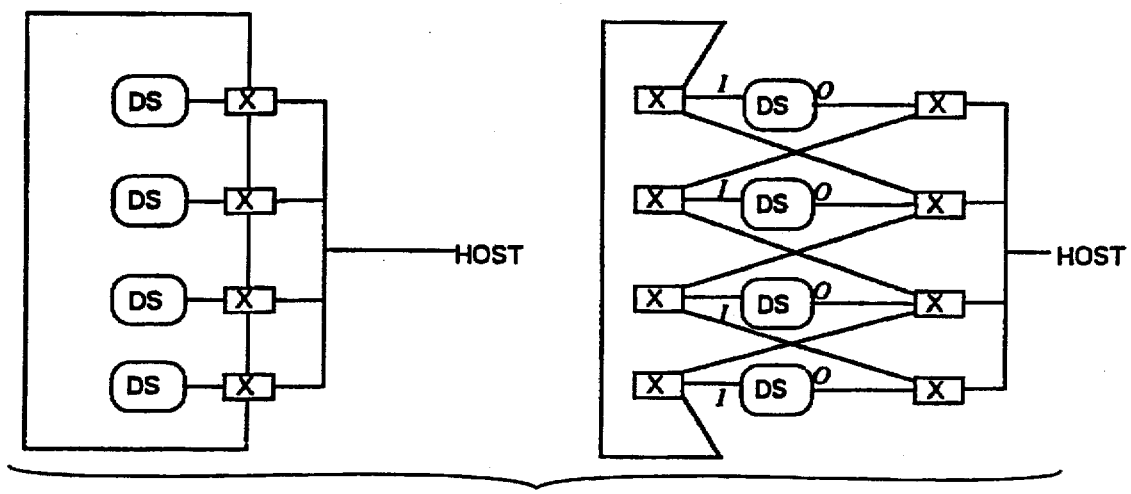
Figures 19, 20:
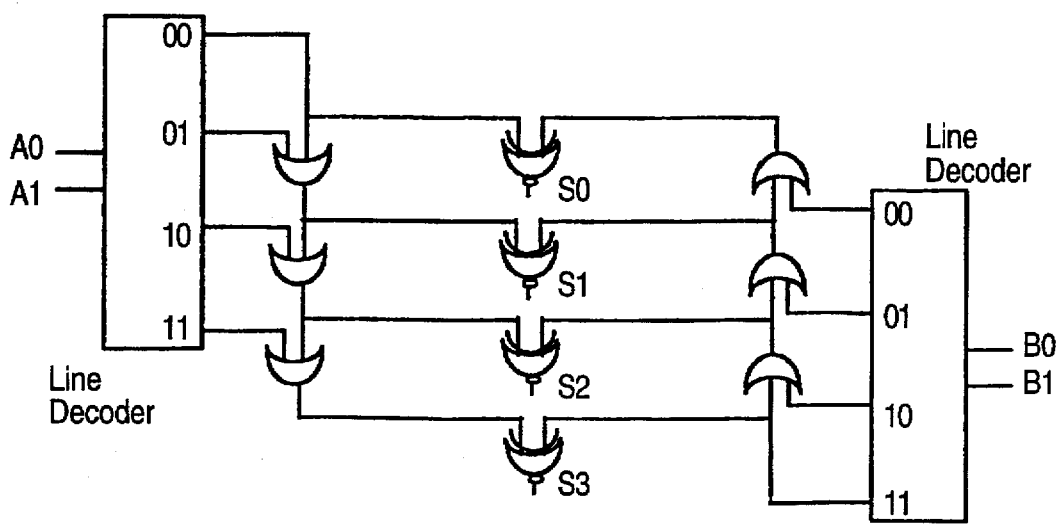
Figure 24:
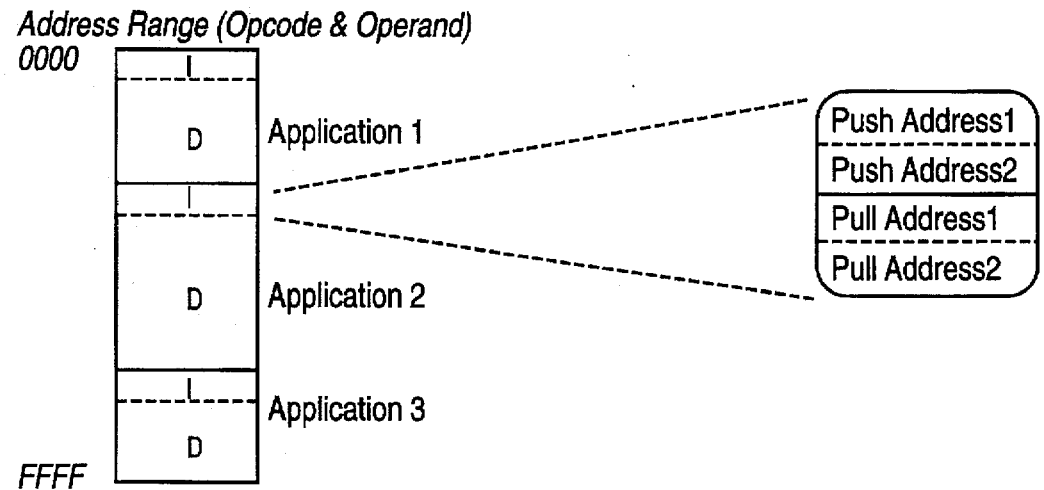
Figure 25:
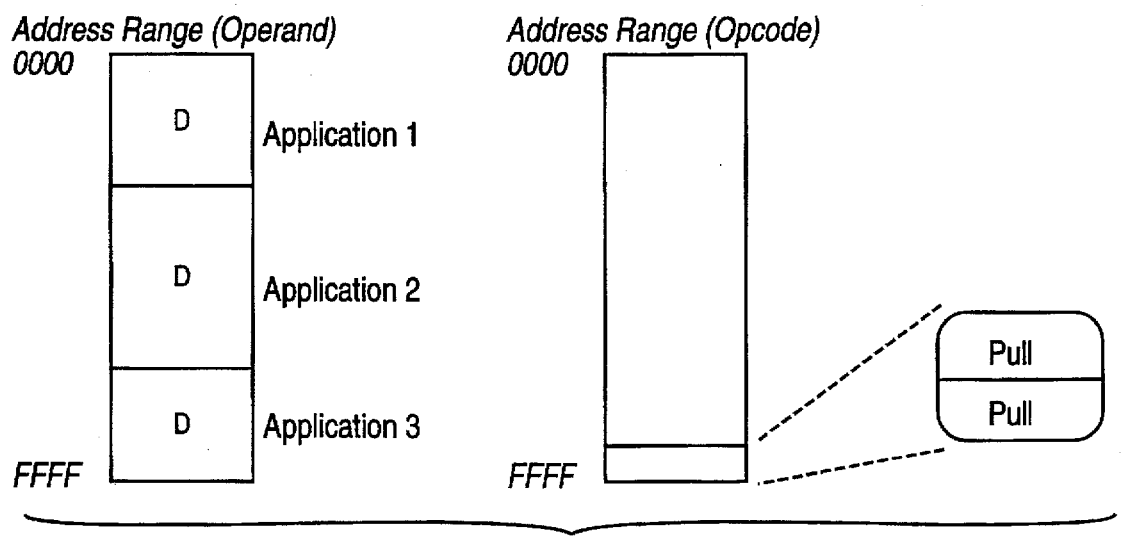
Figures 26, 27, 28:
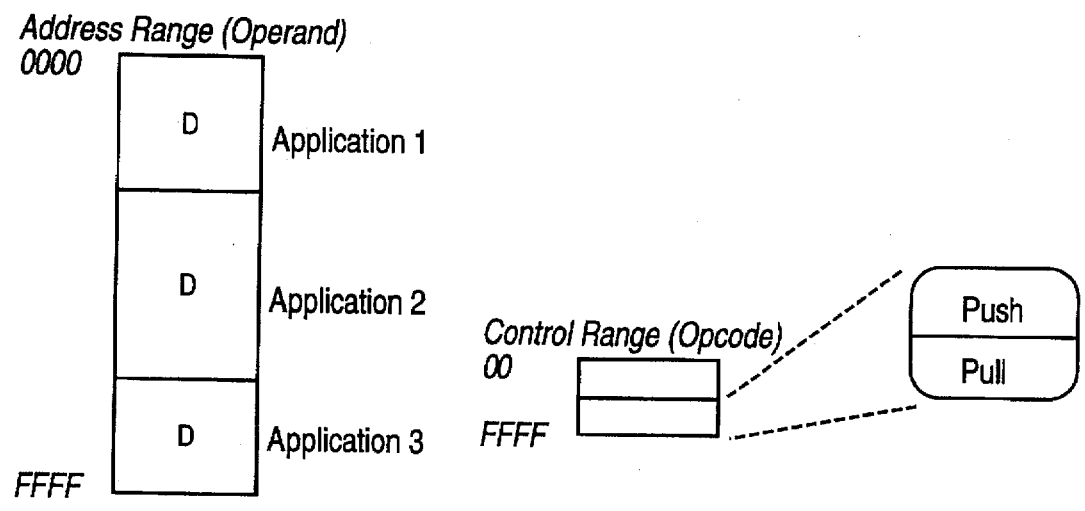
Figure 36:
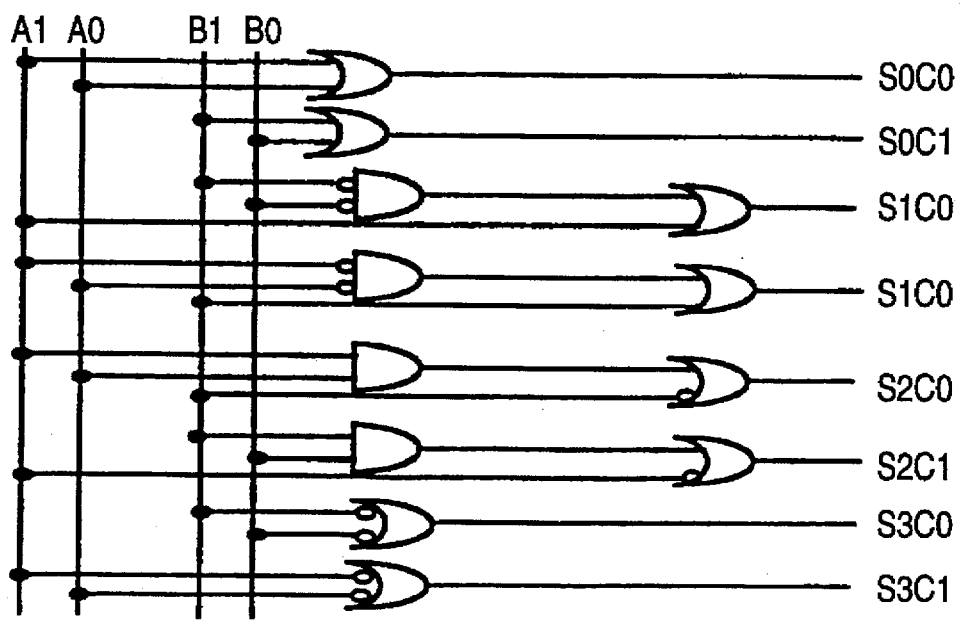
Figure 37:
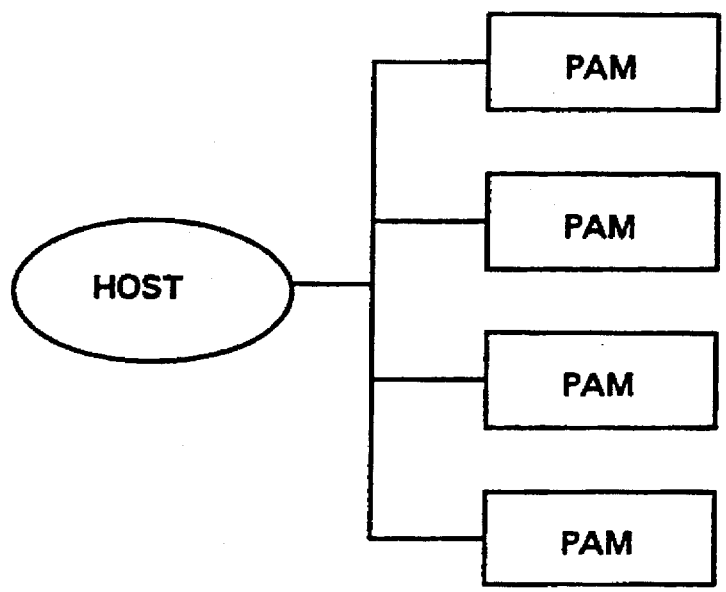
Figure 38:
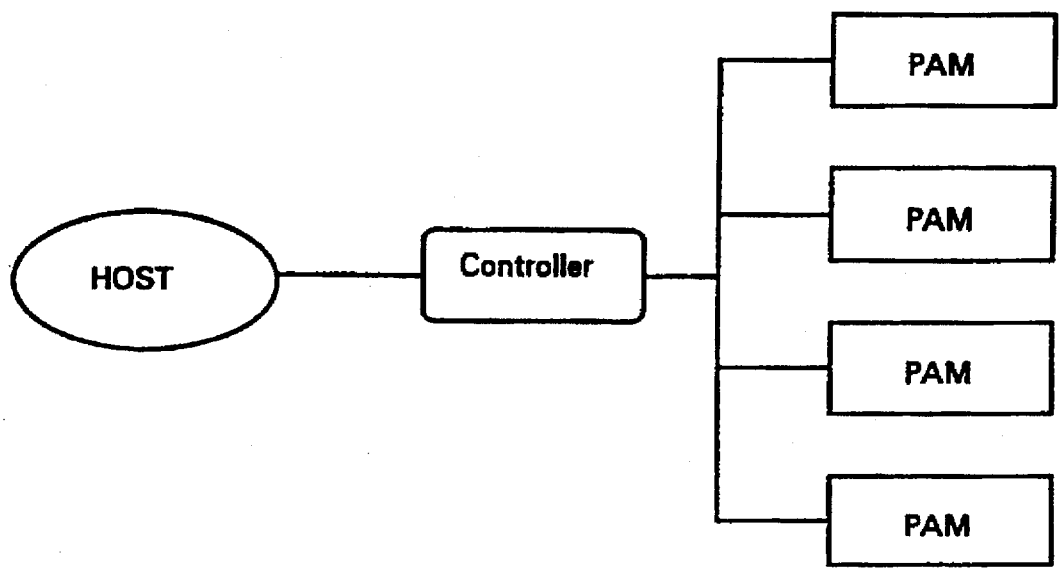
Figure 39:
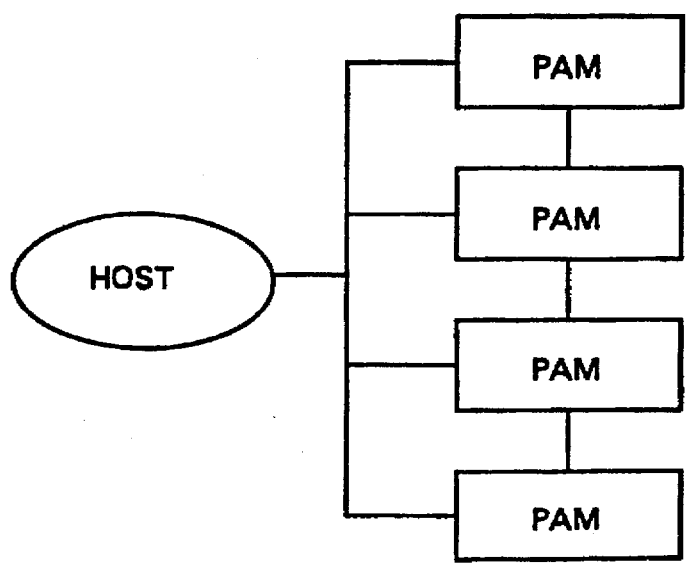

FIGS. 6 and 7 respectively schematically illustrate Back Push-Pull and Front Push-Pull memory systems;

FIG. 8 illustrates different possible memory implementations that can be used for Front or Back Push-Pull memory systems;

FIG. 9 schematically illustrates a data storage element of The Range Shifting Memory;

FIG. 10 schematically illustrates a Range Shifting Memory which makes use of 3-port RAM devices;

FIG. 11 illustrates a single bit memory element which could be used to implement a Range Shifting Memory;

FIGS. 12 and 13 show block schematics for a number of Push-Pull memory configurations using two-ported memory devices;

FIGS. 14, 15 and 16 show block schematics for a number of Push-Pull memory configurations using single ported memory devices;

FIG. 17 illustrates the input and output configuration of a range decoder;

FIG. 18 illustrates a truth table for a "two to four" line address decoder;

FIG. 19 illustrates a truth table for a "two to four" line range decoder;

FIG. 20 illustrates a circuit for implementing a "two to four" range decoder which makes use of "two to four" line decoders;

FIG. 21 illustrates a circuit for implementing a "two to four" range decoder which uses combinational logic;

FIG. 22 is a block schematic illustrating hardware access using instruction registers;

FIG. 23 is a block schematic illustrating hardware access using a distributed hardware interface;

FIGS. 24, 25 and 26 illustrate three methods of Distributed Hardware Interfacing;

FIG. 27 shows several sequential images of a simplified memory map and illustrates how the bidirectional nature of a shift instruction can be used to perform Push and Pull operations;

FIG. 28 shows several sequential images of a simplified memory map and illustrates a Push operation performed with Control lines being used to define Push operation;

FIG. 29 shows several sequential images of a simplified memory map and illustrates a Pull operation performed with Control lines being used to define Pull operation;

FIG. 30 illustrates a table listing the event sequences used to control the Push and Pull operations illustrated in FIGS. 28 and 29;

FIGS. 31 and 32 illustrate the use of consecutive read and write instructions to perform a data shifting as a Push and a Pull operation respectively;

FIG. 33 illustrates a block schematic diagram of an instruction decoder for a Control Line Distributed Hardware Interface system;

FIG. 34 is a table illustrating the relationship between relative addresses, Operation and Control signal in the Instruction Decoder of FIG. 33;

FIG. 35 is a truth table of a "two to four" line shift decoder;

FIG. 36 illustrates a combinational logic circuit which implements the truth table of FIG. 35;

FIGS. 37, 38 and 39 are block schematic diagrams showing methods of cascading Range Shifting Memory modules.

The invention, Intelligent Memory Architecture (IMA), it allows Intelligent Memory Devices to be implemented in an efficient manner. It is consisted of three major modules: the Interface Module (IM), the Access Module (AM) and the Data Module (DM).

Intelligent Memory Architecture provides a standard framework for implementation of Intelligent Memory Devices. The Interface Module (IM) allows instructions to be issued to the Intelligent Memory Device in a multi-user, multi-tasking environment with minimum overhead. The Access Module (AM) facilitates the sharing of Intelligent Memory Device resources by allowing flexible access to specific portions of the Intelligent Memory Device. The Data Module (DM) allows different types of memory elements to be used in the Intelligent Memory Device.

By using Intelligent Memory Architecture, Intelligent Memory Devices can have their functionality greatly enhanced through better hardware/software interface and simplified designs.

3. Intelligent Memory Architecture (IMA)

Figure 1:
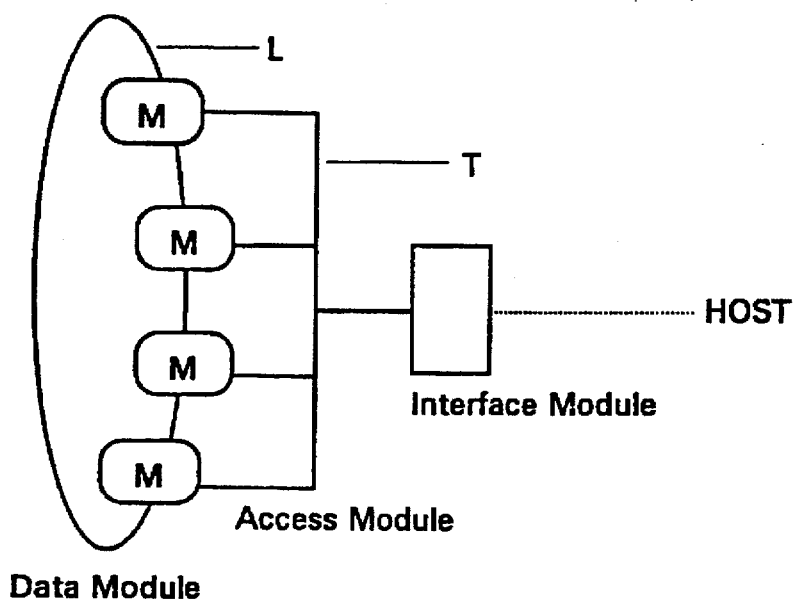
FIG. 1 is a simplified block schematic of a memory system using Intelligent Memory Architecture.
Figure 2:
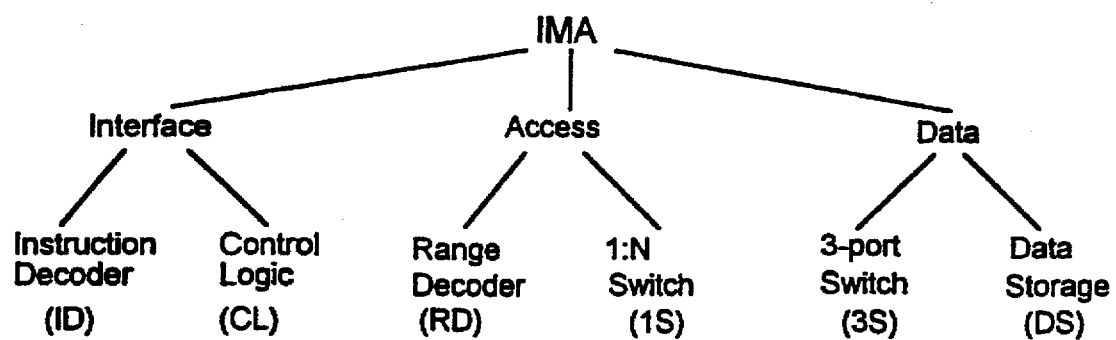
FIG. 2 is a tree diagram illustrating the relationship of the components of Intelligent Memory Architecture.

The block diagram of Intelligent Memory Architecture has a distinctive topography (see FIG. 1.) in which the storage elements of the Data Module (DM) are interconnected with one another in a loop structure L and are connected to the host via parallel switching structure T of the Access Module (AM). The Interface Module (IM) controls the data flow around the loop L of the Data Module and through the parallel structure T of the Access Module. Each of the 3 major modules of a system incorporating Intelligent Memory Architecture have two sub-components as shown in FIG. 2.

The Interface Module (IM) comprises the Instruction Decoder (ID) and the Control Logic (CL). The Instruction Decoder (ID) is responsible for interfacing with the host and decoding all the instructions issued by the host. The Control Logic (CL) gets the result from the Instruction Decoder (ID) to find out what the host wants and controls every thing else in the Intelligent Memory Architecture to perform the required function.

The Access Module (AM) comprises the Range Decoder (RD) and the 1:N switch (1S). The Range Decoder (RD) is responsible for selecting the correct memory banks (M) in FIG. 1.) to operate upon. The 1:N Switch (1S) is a set of parallel switches which control the data paths between the host and the memory banks, allowing the host to access data in all of the memory banks.

The Data Module (DM) comprises Data Storage (DS) and the three Port Switches (3S). The Data Storage (DS) can be any group of addressable memory elements that can store data; flip-flops, registers, dynamic or static RAM, magnetic or optical disks even optical cubes. The selection of which type to use depends on the functions provided by the Intelligent memory device. The Three Port Switch (3S) is responsible for making the selected type of Data Storage device accessible from the host and adjacent memory banks independently of the type of storage elements used in the Data Storage, how many ports the Data Storage has and the nature of those ports.

Figures 3, 4:
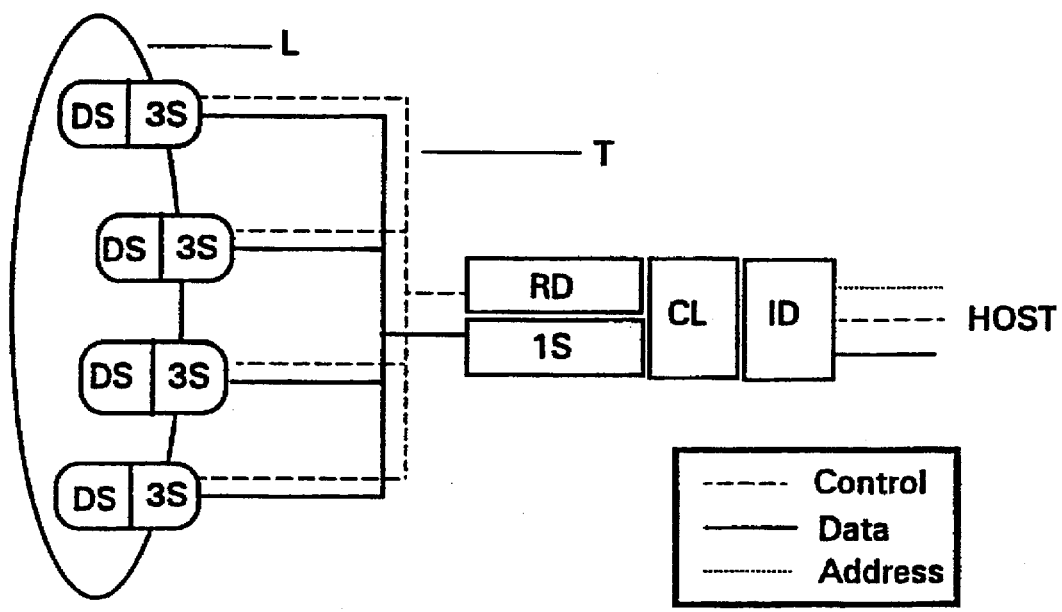
FIG. 3 is a more detailed block schematic of the system of FIG. 1.
FIG. 4 shows a simplified memory map illustrating the effects of a push and pull operation in a Range Shifting Memory (RSM)

A block diagram of the above six components and their inter-relationships is shown in FIG. 3. Note that Intelligent Memory Architecture (IMA) only specifies the Instruction Decoder (ID), Range Decoder (RD) and Three Port Switch (3S) components. The other components (Control Logic (CL), 1:N Switch (1S) and Data Storage (DS)) are application specific and should be defined by the designer on a case by case basis, depending on the value-added functions provided by the particular Intelligent Memory Device.

The implementation of the value-added functions (operations other than standard read and write) for each Intelligent Memory Device is different. By way of example, a novel Intelligent Memory Device known as a Range Shifting Memory (RSM) will be described herein, but the application of Intelligent Memory Architecture is not limited to only this type of device.

4. Range Shifting Memory (RSM)

The shifting of data in memory is a very frequently performed by a software operation. Range Shifting Memory provides a "hardware assisted" method of shifting data, by providing two hardware instructions, Push and Pull. The two instructions, Push(address1, address2) and Pull(address1, address2), are supplied with two input addresses each, defining the address range in memory that will be operated upon.

All data items within the range will be moved into the next storage location in memory during a Push operation and they will be moved into the previous storage location in memory during a Pull operation. As shown in FIG. 4. The Push-Pull operation is similar to that of a shift register. But instead of moving bits left and right within a single word, whole memory words are moved up and down within the memory space. Also unlike a shift register, only specific words, not all words, are shifted at once.

While at first glance it would seem logical that address1 should always be less than address2 this is not the case. In fact, Push(address1, address2) is equal in function to Pull (address2, address1) and via verse. Thus there is really only a need for one shift instruction, but having two separate Push and Pull instructions is useful in explaining the bi-directional nature of the shifting in the context of linear memory addresses.

The aim of the Range Shifting Memory is to shift data, via the Push-Pull instructions, independently of the host. Each Push-Pull operation consists of a sequence of operations to shift data up or down within the memory area. A Push or Pull will be performed depending on the direction of the shift.

Range Shifting Memory is a special type of RAM. Besides standard read/write access to data words in memory, groups of data words in Range Shifting Memory can be shifted to adjacent memory locations very quickly (see FIG. 5.).

5. Push-Pull Methods

The Push-Pull (or shift) operation can be classified as either a Front or Back Push-Pull operation.

In a Back Push-Pull operation, the shifting operation is performed directly on memory cells after the address decoding circuit (see FIG. 6.). This allows shifting of multiple data items concurrently, resulting in very high speeds and would be implemented using devices such as register based FIFOs and the Am95C85. This form of Push-Pull operation is more suitable for VLSI implementation using Charge-Coupled Devices, shift registers etc.

In Back Push-Pull the address decoder is not used for the Push-Pull operation and thus this mode of operation is not limited by the concept of fixed length address locations. Large amounts of data can be moved all at once, resulting in very fast data movement. Existing shift registers or FIFOs are examples of the Back Push-Pull devices. The problem with Back Push-Pull systems is the difficulty in making use of existing memory devices in their implementation.

With Front Push-Pull systems the operation is performed using the address decoding circuit (see FIG. 7.). Data items are normally moved sequentially, one data item at a time, e.g. by the use of the CPU or the DMA controller. The Front Push-Pull form of Range Shifting Memory may make use of readily available RAM chips and could be implemented in VLSI using standard RAM cells.

In order to perform the Front Push-Pull operation, the decoding circuit is used to read the data from one location and then write the data back to another location in the memory. Existing DMA controllers are an example of hardware that uses Front Push-Pull operation. The problem with Front Push-Pull systems is their slow Push-Pull speed.

The Australian Patent Number 627520 describes fast ways of moving data items in memory using Front Push-Pull techniques called Split and Segment Push-Pull operations. These two techniques are optimised for Front Push-Pull operation using conventional single-port memory and buffers. They provide, for the first time, very high speed front Push-Pull systems. Examples of memory devices that support the two different types of Push-Pull systems are shown in FIG. 8.

6. Using Intelligent Memory Architecture for Range Shifting Memory

Intelligent Memory Architecture takes a front or back Push-Pull memory system (like one of those described above) and wraps around it special system interfaces (the Instruction Decoder), decoding logic (the Range Decoder) and data paths (the 3-port Switch). By encapsulating the front or back Push-Pull memories, Intelligent Memory Architecture provides an enhanced Push-Pull memory—the Range Shifting Memory.

All of the data in the Range Shifting Memory can be accessed by the host processor as if they are contained in standard RAM. Specific range of data words in Range Shifting Memory can also be selected and shifted without affecting other data.

The block diagram of the Range Shifting Memory is the same as that of the Intelligent Memory Architecture (FIG. 1.) and has the same loop and parallel switching data paths. It is made up of the same 3 major modules: Data (DM), Access (AM) and Interface (IM). Each major module again has the same two sub-components. (see FIG. 2. and FIG. 3.).

Range Shifting Memory in one broad form provides a method of facilitating data shifting in a computer. It consists of a Data Module (the loop path (L)) for inter-memory bank data transfer, a Access Module (the parallel path (T)) for host access and Interface Module (IM) for interfacing with the host.

In the Range Shifting Memory, the data records being push-pulled, travel along the loop path (L) up and down the memory banks (in the Data Module), while the host accesses data records via the parallel path (T) (in the Access Module). Along the loop path, each memory bank (M) has links to adjacent banks, thus parallel data transfer is possible. With the Range Shifting Memory, the more banks we have, the faster the Push-Pull operation.

Range Shifting Memory has a unified Push-Pull structure that can be used for both Front and Back Push-Pull. It increases Push-Pull speed by breaking the memory up into separate banks and allowing concurrent data transfer between those banks.

The infrastructure provided by Intelligent Memory Architecture gives Range Shifting Memory the ability to perform different types of Push-Pulls and to use different data storage elements allows it to provide more flexible Push-Pulls with increased functionality.

7. Data Module

The Data Module (DM) is made up of memory banks (M) which have three access ports. One port is for normal read/write access to the host. The other two ports are for read/write access to the two adjacent memory banks respectively. All the memory banks (M) are linked together in a loop (FIG. 3.). Each memory bank (M) is made up of a data storage element (DS) and a 3-port switch (3S), as shown in FIG. 9.

The aim of the Data Module is to arrange memory banks into a structure that can be accessed easily by the host and also support efficient intelligent memory operations. By linking different Data Storages (DS) into a loop via the Three Port Switches (3S), it allows information to be passed between adjacent memory banks concurrently resulting in very high bandwidth.

For many other Intelligent Memory Devices, the Three Port Switch (3S) will perform much more than just switching, there can be an arithmetic circuit inside for addition, for example. But in the case of Range Shifting Memory the Three Port Switch only performs switching. Thus Range Shifting Memory is one of the most basic of all Intelligent Memory Devices built with Intelligent Memory Architecture, and can be used as the platform for development of other Intelligent Memory Devices.

The Data Storage (DS) component of memory banks M determines whether the Range Shifting Memory is to implement a Front or Back Push-Pull operation. If there is an address decoding circuit residing inside Data Storage (DS), then the Range Shifting Memory implements a Front Push-Pull. The memory banks are then made up of random access memory (RAM), where we can access individual memory cells by their addresses.

If there is no address decoding circuit inside Data Storage, then the Range Shifting Memory implements a Back Push-Pull operation. The memory banks are then made up of registers, where all the memory cells in the Data Storage (DS) are accessed as a group. We can separately access individual memory cells within Data Storage, by way of the decoding circuit in the Access Module (AM).

The Three Port Switch (3S) is responsible for making all different types of Data Storage (DS) accessible from the host and adjacent memory banks independent of how many ports the Data Storage (DS) has and the nature of those ports.

The memory banks (M) (comprising Data Storage and Three Port Switch), can be implemented in many different ways including simple CMOS transmission gates, single transistor dynamic RAM cells, six transistor static RAM cells, flip-flops, external RAM chips, charge coupled devices, magnetic disks or optical cubes.

We can implement the Front Push-Pull Range Shifting Memory using triple-port (3-port) RAM in the memory bank M, as shown in FIG. 10. The Push-Pull logic circuit controls the address and read/write lines of the two "Up and Down" ports of the 3-port RAM so to provide Push-Pull functionality, and the host controls the remaining port for normal read/write operation. In this case, the Three Port Switch is built into and is part of the 3-port RAM, and there is no need for a separate Three Port Switch.

The Front Push-Pull action is achieved by the control logic setting the address lines of the 3-port RAMs and toggling the read/write lines. So, in a push down operation, each of the up ports in the 3-port RAM will be set to receive data from the down port immediately above.

If the Range Shifting Memory needs to supply a total capacity of 2K words by 8 bits, then with 64 banks (M), each 3-port RAM requires a capacity of 32 by 8. In this case, the word size of the 64 3-port RAM banks is the same as that of the memory banks (M). Note that the RAM word size can be smaller, in which case we then simply cascade more Range Shifting Memorys in parallel to achieve bigger Range Shifting Memory word size.

For Back Push-Pull operation, each memory bank (M), can be implemented with a Push-Pull register that is made up of a plurality of single bit devices similar to that shown in FIG. 11. The single bit device of FIG. 11 is built with a multiplexer feeding data into a D flip-flop. The Push-Pull logic controls the CTL and CLK signals to facilitate the Push-Pull operation.

The Back Push-Pull action is achieved by the control logic setting the CTL signals and toggling the CLK signals. So, in a push down operation, all of the CTL signals will be set such that data at the input line taking a signal from above will be passed to the input port of the D flip-flop and then the CLK line is toggled to store that data.

The number of these one bit devices required depends on the word size of the Push-Pull register, if we have 8-bit Push-Pull registers then 8 of those one bit devices are needed for each register. Since each Push-Pull register equates to one memory element M, the number of memory elements in a Range Shifting Memory is the same as the number of Push-Pull registers. If the Range Shifting Memory needs to supply a total capacity of 2K words by 8 bits, then we need 2K banks, that is 2K of 8-bit Push-Pull registers. In this case, the Three Port Switch is the 4 to 1 multiplexer in front of the D flip-flop.

Besides the existence and non-existence of decoding circuits (for Front or Back Push-Pull devices), there are other differences between one type of Data Storage and another, like number of ports, whether there are separate I/O connections and whether the Data Storage devices support concurrent read/write to the same location etc. The Data Storage (DS) being used in FIG. 10. has three bi-directional ports, while the Data Storage (DS) used in FIG. 11. has a single port with separate I/O.

A distinctive feature of the Data Module (DM) when used as a Push-Pull structure is that it allows loopback, thus items in the bottom bank can be pushed back to the top bank and items in the top bank can be pulled into the bottom bank. This loopback feature is vital in Split and Segment Push-Pull operations where standard RAM banks are used as Data Storage devices as it allows communication between the top and bottom banks and thus enables the Push-Pull action to be performed on data sets that have more data items than the number of banks.

7.1 Data Module Implementation

FIG. 12 shows two examples of implementation of the Data Module using dual-port Data Storages (DS) with switches (S). The switches (S), are simple on-off devices that either pass the data or block it. CMOS transmission gates or tri-state transceivers can be used to implement the switches (S). FIG. 13 shows two examples which use crossbars (X) instead of switches. These crossbars can selectively link any of their ports together at one time. However, the crossbars are quite expensive, and multiplexers can be used to emulate their function.

FIG. 14 shows two examples of implementations of the Data Module Loop Structure and Access Modules (Three Port Switch and 1:N Switch) using single port Data Storages (DS) with switches (S). Note that the right-hand example requires less switches but has reduced host access performance. FIG. 15 shows two examples using crossbars (X) instead of switches. Note that the right-hand example uses Data Storage (DS) elements with separate I/O instead of hi-directional I/O. The Three Port Switch (3S) in this embodiment is similar to the Three Port Switch in FIG. 11. since they each have to support single-port Data Storage (DS) with separate I/Os.

Another variation using single port Data Storage (DS) with separate I/O is shown in FIG. 16. In this embodiment each Three Port Switch (3S) is divided into two parts S1 and S2. During host access both S1 and S2 are closed, during Push-Pull operation one is open the other is closed, this effectively creates two loops for Push-Pull data to pass along depending on whether a Push or a Pull operation is being performed.

Buffers can be added to the Three Port Switch (3S) to improve operation. They can be used to hold data temporarily during their travel between Data Storages (DS), which is useful when the Data Storage has a limited number of ports or when the Data Storage doesn't support concurrent access from multiple ports to the same memory location. The Split and Segment Push-Pull technique described in Australian Patent Number 627520 is based on the use of buffers in Front Push-Pull modules.

There can be other further variations to the Range Shifting Memory. For memory with more than three ports, we can implement Range Shifting Memorys with multiple memory loops L or multiple host access (3S), thus allowing multiple Push-Pulls and hosts accesses to occur concurrently. Also, if the number of memory bank (M) is equal to the number of words in the Range Shifting Memory, then the Data Module becomes a linear path, because there is no need for loop back. But the basic philosophy and components, with the Three Port Switches (3S) and Data Storages (DS), remained the same.

8. Access Module

In order to support the multi-user and multi-tasking environments, a way of controlling the access to the memory banks in the Data Module (DM) is required. Since most memories have linear addresses, a way of selecting address ranges by hardware will allow very efficient access to groups of memory banks in the Data Module.

The Access Module (AM) allows the host (via the Interface Module) to access the Data Module (DM). It performs address decoding and data switching, and is made up of a 1:N Switch (1S) and a Range Decoder (RD). (see FIG. 2. and FIG. 3.)

8.1. Range Decoder

Decoding is the central part of Intelligent Memory Architecture, and in fact this is one of the features that sets it apart from other memory hardware. The decoding makes the Intelligent Memory Device look like standard RAM to the host processor thus making it very easy to use and manage. It also allows multiple Intelligent Memory Devices to be cascaded together to provide wider words or more words.

In order for the Access Module (AM) to be implemented effectively, a novel Range Decoder (RD) is used for the purpose of selecting a specific range of data items in memory. The Range Decoder (RD) has two sets of inputs and one set of outputs (FIG. 17.). The begin address (A) and the end address (B) are applied to the two sets of inputs respectively and all of the outputs that are between those two address will be selected (S). In the binary case, if the addresses are n bits wide then there will be 2n inputs (for the 2 addresses) and $2^n$=m outputs. The rest of this specification will use the binary range decoder as an example, but the scope of the invention should not be limited to this embodiment.

The range decoder is a super-set of the standard line decoder. Rather than selecting a specific line that corresponds to the value of one input code (as in 2 to 4 line decoders), the range decoder selects all of the lines between the values of two input codes (a 2 to 4 range decoder has the same number of outputs, 4, as the line decoder but has 4 inputs rather than 2).

The truth tables of a 2 to 4 line decoder and 2 to 4 range decoder are shown in FIG. 18. and FIG. 19. respectively. Note that if the two input values are the same then the range decoder becomes a normal line decoder.

The more memory banks (M) in the Data Module (DM), the larger the range decoder needs to be. If we have 64 banks then we need a 6 to 64 range decoder. The range decoder can be implemented with hardwired combinational logic or using a ROM table or with comparators. FIG. 20. shows a serial combinational logic partial implementation of a 2 to 4 range decoder, while FIG. 21. shows a parallel combinational logic full implementation of a 2 to 4 range decoder.

With the range decoder, the Access Module has the ability to select any user-defined continuous range of address after being given the begin address and end address of the range.

8.2 1:N Switch

The 1:N Switch (1S) in the Access Module (AM) is used to concentrate the data from the large number of Three Port Switches (3S), so that the host can access the Data Storage (DS) in a transparent manner. It switches the single data bus from the host between the memory banks (M) in the Data Module (DM). If there are 64 Memory Banks in the Data Module then we need a 1:64 switch. The 1:N Switch can be built using multiplexers, crossbars or simply a tristate bus with enable pins on each memory bank (M).

In the case of FIG. 10., the 1:N Switch is built into the 3-port RAM, since the 3-port RAM supports tri-state buses. In case of FIG. 11., the 1:N Switch is not shown, but it can be implemented with wired-or gates, tri-state buffers or multiplexers.

9. Interface Module

The high data transfer speed of the Range Shifting Memory is available to the host through the Interface Module (IM). All Interface Modules of Intelligent Memory Architecture use an novel hardware/software interface called Distributed Hardware Interface (DHI). A Distributed Hardware Interface overcomes a lot of the problems experienced by current hardware/software interfaces. Although a Distributed Hardware Interface is illustrated with Range Shifting Memory here, it can be used by other Intelligent Memory Devices for improved hardware/software interfacing as well.

Most software accesses hardware via a set of instruction registers. The registers are mapped into a single fixed set of memory addresses that are shared by all applications. A layer of software must be added above the hardware to manage the shared address space, as shown in FIG. 22. This software approach, although commonly used, is very complex, slow, non-scaleable and non-portable.

To avoid problems associated with such software "device driver" schemes, a Distributed Hardware Interface allows the Range Shifting Memory to be utilised without the need of special management software. The instructions to Range Shifting Memory are distributed in the sense that all applications have assigned to them their own Range Shifting Memory address space (where protection is enforced transparently by the processor's own memory management system) and the instructions they issue in that address space will only apply to data items in the same address space.(FIG. 23.)

Rather than having separate instruction or command pins on the hardware package, a Distributed Hardware Interface is implemented by using the standard pins on memory packages: the address pins, the data pins and the control pins (such as chip select and read/write). Programs issue commands by standard read/writes to their allocated memory range.

Most instructions or commands have two parts, the opcode and the operand. The opcode indicates the action to be performed while the operand indicates what the action is to be performed on. In a Distributed Hardware Interface both opcode and operand must be represented using standard address, data and control signals that are available on standard memory devices such as a static RAM chip.

9.1. Types of DHI

One type of Distributed Hardware Interface, termed Address DHI, is shown in FIG. 24. where the memory space allocated to each application is divided into instruction (I) and data (D) space. Within the instruction address space, the value of the memory address indicates the specific opcode, while the value of the read/write data to that address is the operand for that opcode.

To perform the operation Push(address1, address2) we write the required operands, address1 and address2, into the appropriate instruction addresses. This scheme is called Address DHI, because different opcodes are identified by the different addresses they have in memory. As indicated before, only the one instruction, like the Push instruction, is needed because of its ability to perform Pull operation when address2 and address1 are reversed. However we have shown the Pull instruction as well, to demonstrate how the scheme works.

Another form of Distributed Hardware Interface is Data DHI. It reverses the role of address and data in Address DHI. The address is now used to indicate the operand while the data is used to indicate the opcode, as shown in FIG. 25. Each application still has its own address space, but there is no instruction space any more, only data space. A specially assigned data value is now used to indicate the opcode. Thus there are some data values that the applications cannot use, as they have a special meaning to the Distributed Hardware Interface.

A special data value that will not be used by the applications, say FFFF, will be assigned as an opcode. To perform Push(address1, address2), FFFF is written to address1, but rather than writing over the top of the original data stored in address1, FFFF indicates to the Range Shifting Memory (RSM) that a Push(address1, address2) operation is about to begin and address1 is one of the operands. The address of the next write will be taken as address2, thus the Push(address1, address2) operation can start immediately after that write.

Yet another type of Distributed Hardware Interface is Control DHI, where different opcodes are identified by the control signals (like read/write) supplied to Range Shifting Memory. The address pins and/or the data pins can be used to supply the operand.

An embodiment which uses the address pins to supply the operands would operate as follows. To perform the operation Push(address1, address2), a read is performed at address1. The next write to address2 will start the Push(address1, address2) operation. Thus the addresses of all read operations are constantly stored as address1 and when the first write comes along, that address will be used as address2 to perform the Push(address1, address2) operation (see FIG. 26.). This scheme only supports a small number of opcodes but is adequate for simple devices such as Range Shifting Memory.

9.2 Control DHI for Range Shifting Memory

Besides standard read/write access to data words in memory, groups of data words in Range Shifting Memory can be Push-Pulled to adjacent memory locations. Thus Range Shifting Memory supports the following operations:

Read(address, data)—read data from address, equivalent to standard read from RAM.

Write(address, data)—write data to address, equivalent to standard write to RAM.

Shift(address1, address2)—shifts all the data words between address1 and address2, from address2 towards address1. This shift operation implements both a pull up (address1<address2) and a push down (address1>address2). (see FIG. 27.) Note that the memory contents of address1 always get destroyed by the shift, while the contents of address2 always get duplicated.

Using a Distributed Hardware Interface, Range Shifting Memory has no explicit shift instructions. Programs issue shift commands by standard read/writes to their allocated memory range. This is possible by incorporating the Shift (address1, address2) operation into the Read(address1, data) and Write(address2, data) operations. The first shift address (address1) is supplied through a read access and the second shift address (address2) is supplied through the following write access. The shift operation is thus always make up of a read access followed by a write access. All of the data words between the write address (address2) and the previous read address (address1) are shifted one position from the write address towards the read address.

The host processor performs standard read/write cycle to Range Shifting Memory as if it is normal RAM. The read cycle, Read(address1, data), is exactly the same as that of normal RAM. An address (address1) is supplied to Range Shifting Memory and a data word from that address is retrieved. The write cycle, Write(address2, data), is slightly different in that before writing the data word (data) into the given address (address2), the shifting from address2 towards address1 will occur. After the shift the data word (data) is then written into the write address (address2).

In FIG. 28. a push down from address 1 to address 5 is shown. A Read(5,f) operation is followed immediately by a Write(1, x) operation, this is similar to an operation sequence that consists of a Read(5,f) followed by a Shift(5, 1) followed by a Write(1, x). The actual shifting operation is thus the first part of the Write operation.

FIG. 29. shows a pull up from address 5 to address 1. The Read(1,b) operation is followed immediately by a Write(5, y) operation. A register inside Range Shifting Memory keeps track of the last read address (1), when the next write to address 5 occurs, the shifting operation Shift(1, 5) beings. The write address (5) and the last read address (1) together defined the address range in Range Shifting Memory, that data is to be shifted, and the direction of the shift. Finally, the value y is written into address 5, just as in normal write cycle.

The "shifting" operation is thus "implied" through standard memory read/writes. By removing the need of a separate Shift operation, Range Shifting Memory software is simplified substantially and Range Shifting Memory hardware interfaces with any processor and memory systems easily. FIG. 30. summarizes the possible access sequences and the actual operations.

Since the Control DHI uses sequence sensitive operations, in a multitasking environment, the read and write instructions need to be packaged one after the other into one operation so that the Interface Module will not get confused by some other application doing read or writes to it in between.

Some computers do not support this type of operation packaging and might not have other forms of support for semaphores, but almost all of them support the single operation data exchange instruction. That is, the data value of a memory location and a processor register can be exchanged in a single operation, thus read and write can be performed to the same address in one single operation. The exchange instruction guarantees that a write will follow immediately after a read to the same address. To make use of the exchange instruction, a slight modification of the above Control DHI can be used.

The address1 of the Shift(address1, address2) instruction is obtained by tracking all read operations. If a read from address1 is followed immediately by a write to (the same) address1 then the data written to address1 is taken as address 2. The Shift(address1, address2) operation is then performed. Note that with the new Control DHI address 1 is supplied via the address pins while address 2 is supplied via the data pins.

FIG. 31. shows the exchange of content of address 5 (which contains a value of f) with content of a register (which contains a value of 1). Thus the single exchange instruction implements a Shift(5,1) operation. FIG. 32. shows the exchange of content of address 1 (which contains a value of b) with content of a register (which contains a value of 5). Thus the single exchange instruction implements a Shift(1,5) operation.

9.3 Implementation of Interface Module

In some systems, a combination of the 3 Distributed Hardware Interface schemes can be used and further variations can be introduced by making the opcodes sequence sensitive (like the Control DHI described above). So the same opcode can represent different instructions depending on operations that have occurred before it.

Different Distributed Hardware Interface schemes are useful in different situations, but all schemes are implemented by the Interface Module which is make up of the same two components: a Instruction Decoder (ID) that latches the address, data and control signals, and then decodes them; and the Control Logic (CL) that takes the decoded result and controls the rest of the Intelligent Memory Device.

FIG. 33. shows the block diagram of an efficient Instruction Decoder implementation that is opcode sequence sensitive. Registers are used to latch the opcodes and operands from the address, data and control bus. A buffer is available to store previous states of the registers so the comparator can be used to compare its value with those in the registers. The state machine then change to the appropriate state depending on the values in the registers and the result of the comparator.

The other component of the interface module, the Control Logic, is highly application specific and can be implemented with standard logic design techniques, like state machines, and will not be discussed further in this specification.

10. Range Shifting Memory Implementations

Implementing Range Shifting Memory in integrated circuits is very efficient. These Range Shifting Memory chips can be built with gate arrays, standard cells or full custom designs. For low capacity designs even FPGAs can be used. Since, like Intelligent Memory Architecture, Range Shifting Memory is a concept, and its realisation can take a number of forms.

Range Shifting Memory chips can be used directly in building of new computers or they can be used in form of memory plug-in boards or co-processors for existing computers. Range Shifting Memory is mapped into the physical address space of the host processor.

10.1. Shift Decoder

An important function of the Access Module is to control the 3-port Switches (3S). The Three Port Switches have to be "told" which way to pass data. Using Control DHI, we supply two addresses to the Range Shifting Memory, a read address (A) and a write address (B). If the read address is greater than the write address (A>B), then we have a Push operation. If the read address is less than the write address (A<B), then we have a pull operation.

FIG. 34. gives an example of the possible signals generated for the Three Port Switches, depending of the read-write addresses supplied. For example, these signals can be used as the control signal (CTL) for the multiplexer in FIG. 11.

Since, like the range decoder, these Three Port Switch control signals require the read address (A) and the write address (B) as inputs. We can combine the ability to generate these signals into a Range Decode (RD) to form a Shift Decoder (SD). The truth table of a 2 to 4 Shift Decoder is shown in FIG. 35.

The Shift Decoder (SD), takes the read and write addresses, and produces the required signals to drive all of the Three Port Switches (3S). A parallel implementation of a 2 to 4 shift decoder is shown in FIG. 36. Note that there are 8 outputs rather than 4, because although the decoder supplies signals to four Three Port Switches (3S), each Three Port Switch requires 2 bits of control information (C0 and C1).

10.2. Cascading Range Shifting Memorys

Range Shifting Memory chips can be cascaded together to support larger data words (memory width) or more data words (memory depth). Range Shifting Memory cascading is similar to RAM horizontal (data path) and vertical (address path) cascading. Extra address decoding circuits (like Range Decoders or Shifts Decoders) have to be added to control the multiple chips.

Increasing memory width (horizontal cascading) is quite straight forward since there is no communication between Range Shifting Memory chips. Increasing memory depth (vertical cascading) is more complex. If a data set crosses chip address boundaries, then during a Push-Pull operation, data must be moved from one chip to the next. This can be performed either by software or hardware.

The Distributed Hardware Interface is well suited to the software approach. Using the two overlapped "read-write" sequences, one on each chip, data is transferred between the chips. The read step gathers data from one chip while supplying its shift address and the write step deposits the data into the next chip while supplying its shift address. The data path remains quite simple, as shown in FIG. 37.

The hardware approach varies from a simple external controller that issues the two "read-write" sequences instead of the CPU (FIG. 38.) to extra dedicated data buses and logic on each Range Shifting Memory chip for moving data crossing chip boundaries (FIG. 39.).

We can form a hierarchy of Range Shifting Memorys. The Range Shifting Memorys can be constructed on circuit boards with Range Shifting Memory chips themselves. Each Range Shifting Memory chip acts like an individual memory bank (M), with the other components (like Access Module and Interface Module) provided by external logic on the circuit board. And the circuit boards themselves can be treated as memory banks (M) supported by other external logic to form a very big Range Shifting Memory that is built up of smaller ones.

Cascading of Range Shifting Memory chips also allows Multiple Speed Push-Pull. That is the Range Shifting Memory chips can run at a different clock speed to the inter-chip data transfer. Data items can move within chips at 100 MHz between the memory banks and move between chips at 50 MHz. This is because data can be transferred much faster within the chip than between chips.

The principles of Split and Segment Push-Pull operations can be applied here. For example, Memory banks (M) can be grouped together to form blocks, with each block using a Segment Push-Pull operation to transfer data within itself. Between blocks, a Split Push-Pull operation can be used. If the blocks are on different chips then the Split Push-Pull operation can effectively speed-match between the Push-Pull operations within the chip and across the chip address boundary.

11. Conclusion

With the simple interface provided by Intelligent Memory Architectures, Range Shifting Memory applications can be developed under existing operating systems using standard compilers. Intelligent Memory Architecture also provides Range Shifting Memory with a very fast data transfer rate via the multiple banks in the Data Module. The Interface Module makes that speed readily available to multiple applications, with low overhead. While the Access Module allows different applications to share Range Shifting Memory easily.

Using Intelligent Memory Architecture's unique design, Range Shifting Memory differs from other data moving hardware techniques in the following functional ways:

(1) It is based on a word address scheme. Where data bits are grouped into fixed length words that can be moved and accessed as one entity and not as an arbitrary number of bits.

(2) The data words are accessed individually by the host through linear numerical addresses, just like that of standard RAM.

(3) Its capacity is measured by "the number of bits per word by the number of words" e.g. 2K words by 8 bits. Same as standard RAM.

(4) It can be easily cascaded together with other Range Shifting Memory to form larger word size or to supply more words. Again, like standard RAM.

(5) With the 3-port switch (Three Port Switch), a large number of different memory types can be used for data storage; allowing speed, capacity, cost and design trade offs.

(6) With the range decoder (RD), data words are moved by range, and not as a whole. Data words can be identified in user defined groups and thus can be shifted without affecting other data words in the Range Shifting Memory.

(7) Using a Distributed Hardware Interface, Range Shifting Memory provides a very efficient data shifting interface with software in multi-user, multi-tasking environments.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

I claim:

1. A memory module for storing data, and having a memory array organized as a plurality of contiguous memory banks, each memory bank having a plurality of data storage elements and three external data paths respectively communicating with two adjacent memory banks and with a host computer, the module having an access system arranged to provide a plurality of access modes to the memory array, one of said modes including concurrent selection and activation of multiple memory banks between two given addresses, and an interface system arranged to interpret access requests delivered to the module via address, data and control lines and to provide control signals to the access system to select the required access mode, to provide address information to select the storage element or elements to be accessed within an address space of the array, and to provide access to the selected storage element or elements, the interface and access systems being arranged to provide conventional read/write access to the memory array in response to a conventional read/write request to the memory module and to provide additional access modes which allow data to be operated on within the memory module independently of a system to which the memory module is connected, the interface system being arranged to decode information provided via the address, data and/or control lines of the module during a conventional read or write operation to the address space of the memory array to determine the begin and end address of the data to be operated on and the form of a data operation to be performed.

2. The memory module of claim 1 wherein an operation instruction directing the interface system to perform the data operation is indicated to the interface system by writing a predetermined data word to a storage location within the address space of the memory module.

3. The memory module of claim 1 wherein an operation instruction directing the interface to perform the data operation is indicated to the interface system by performing an access to a predetermined address or an address within a predetermined range of address.

4. The memory module of claim 1 wherein an operation instruction directing the interface to perform the data operation is indicated to the interface system by a predetermined sequence of control signals.

5. The memory module of claim 4 wherein the predetermined sequence of control signals correspond to a read operation within the address space of the memory module, followed by a write operation within the same address space.

6. The memory module of claim 4 wherein the begin and end addresses of the data to be operated on are provided on the address lines of the module.

7. The memory module of claim 6 wherein the end address of the data to be operated on is given by the address specified in said read operation and the begin address of the data to be operated on is given by the address specified in said write operation.

8. The memory module of claim 7 wherein the read operation is functionally equivalent to a conventional read operation on the memory array and the write operation is functionally equivalent to a conventional write operation on the memory array, but wherein the write function is delayed until after the data from the storage element at the begin address has been operated on.

9. The memory module of claim 4 wherein the begin and end addresses of the data to be operated on are provided on the address and data lines of the module.

10. The memory module of claim 9 wherein the end address of the data to be operated on is given by the address specified in said read operation and the starting address of the data to be operated on is given by the data specified in said write operation.

11. The memory module of claim 10 wherein the interface system includes address range decoding means, comprising first and second address input means, decoding logic means and a plurality of address selection outputs, there being one output for each address in the storage array, the address range decoding means being arranged to accept begin and end address codes as said first and second address inputs respectively and the decoding logic being arranged to activate those outputs corresponding to the first and second input addresses and each address between the first and second input addresses to facilitate operating on the data in the range of storage locations bounded by the begin and end addresses.

12. The memory module of claim 11 wherein the interface system includes an instruction decoder comprising first and second address input means, instruction decoding logic and at least one output arranged to indicate the operation instruction, the instruction decoding logic being arranged to compare the first and second addresses and to set the output depending upon their relative values.

13. The memory module of claim 8 wherein the interface system includes address range decoding means, comprising first and second address input means, decoding logic means and a plurality of address selection outputs, there being one output for each address in the storage array, the address range decoding means being arranged to accept begin and end address codes as said first and second address inputs respectively and the decoding logic being arranged to activate those outputs corresponding to the first and second input addresses and each address between the first and second input addresses to facilitate operating on the data in the range of storage locations bounded by the begin and end addresses.

14. The memory module of claim 13 wherein the interface system includes an instruction decoder comprising first and second address input means, instruction decoding logic and at least one output arranged to indicate the operation instruction, the instruction decoding logic being arranged to compare the first and second addresses and to set the output depending upon their relative values.

15. The memory module of claim 14 wherein the address range decoding logic is incorporated into the instruction decoding logic and the instruction decoder provides at least two output bits for each storage location in the memory array, to select the location as one to be operated on and to indicate the operation to be performed.

16. The memory module of claim 13 wherein the decoding logic comprises a programmed ROM.

17. The memory module of claim 13 wherein the decoding logic comprises a set of range selection outputs, a pair of line decoding circuits and combinational logic, the decoding circuits and combinational logic providing signals to the range selection outputs.

18. The memory module of claim 13 wherein the decoding logic comprises a combinational logic circuit.

19. The memory module of claim 15 wherein the decoding logic comprises a programmed ROM.

20. The memory module of claim 15 wherein the decoding logic comprises a pair of line decoding circuits and combinational logic to derive range selection outputs.

21. The memory module of claim 15 wherein the decoding logic comprises a combinational logic circuit.

22. The memory module of claim 1 wherein the operation to be performed on the data is a shifting of data from one storage location to another within the memory array.

23. The memory module of claim 22 wherein the shifting operation is performed on one or more contiguous storage elements.

24. The memory module of claim 23 wherein the shifting operation is arranged to shift the data in each of the one or more contiguous storage elements to an adjacent storage element in a given direction.

25. The memory module of claim 24 wherein the interface system decodes information provided via the address, data and/or control lines of the module to determine the begin and end address of the data to be shifted and the direction of the shift.

26. The memory module of claim 25 wherein the shift instruction is indicated to the interface system by a predetermined sequence of control signals.

27. The memory module of claim 26 wherein the predetermined sequence of control signals correspond to a read operation within the address space of the memory module, followed by a write operation within the same address space.

28. The memory module of claim 27 wherein the begin and end addresses of the data to be operated on by the shift operation are provided on the address lines of the module.

29. The memory module of claim 28 wherein the end address of the data to be shifted is given by the address specified in said read operation and the begin address the data to be shifted is given by the address specified in said write operation.

30. The memory module of claim 29 wherein the read operation is functionally equivalent to a conventional read operation on the memory array and the write operation is functionally equivalent to a conventional write operation on file memory array, but wherein the write function is delayed until after the data from the storage element at the begin address has been shifted to the adjacent location.

31. The memory module of claim 27 wherein the begin and end addresses of the data to be operated on by the shift operation are provided on the address and data lines of the module.

32. The memory module of claim 31 wherein the end address of the data to be shifted is given by the address specified in said read operation and the begin address of the data to be shifted is given by the data specified in said write operation.

33. The memory module of claim 32 wherein the interface system includes address range decoding means, comprising first and second address input means, decoding logic means and a plurality of address selection outputs, there being one output for each address in the storage array, the address range decoding means being arranged to accept begin and end address codes as said first and second address inputs respectively and the decoding logic being arranged to activate those outputs corresponding to the first and second input addresses to facilitate shifting the data in the range of storage locations bounded by the begin and end addresses.

34. The memory module of claim 33 wherein direction of shifting is determined by the relative magnitudes of the first and second address.

35. The memory module of claim 30 wherein the interface system includes address range decoding means, comprising first and second address input means, decoding logic means and a plurality of address selection outputs, there being one output for each address in the storage array, the address range decoding means being arranged to accept begin and end address codes as said first and second address inputs respectively and the decoding logic being arranged to activate those outputs corresponding to the first and second input addresses and each address between the first and second input addresses to facilitate shifting the data in the range of storage locations bounded by the begin and end address.

36. The memory module of claim 35 wherein direction of shifting is determined by the relative magnitudes of the first and second address.

37. The memory module of claim 35 wherein the interface system includes an instruction decoder comprising first and second address input means, instruction decoding logic and at least one output arranged to indicate shift direction, the instruction decoding logic being arranged to compare the first and second addresses and to set the output depending upon their relative values.

38. The memory module of claim 37 wherein the address range decoding logic is incorporated into the instruction decoding logic and the instruction decoder provides a two bit output for each storage location in the memory array, to select the location when it is to be shifted and to indicate the shift direction.

39. The memory module of claim 36 wherein the decoding logic comprises a programmed ROM.

40. The memory module of claim 35 wherein the decoding logic comprises a set of range of selection outputs, a pair of line decoding circuits and combinational logic, the line decoding circuits and combinational logic providing signals to the range selection outputs.

41. The memory module of claim 36 wherein the decoding logic comprises a combinational logic circuit.

42. The memory module of claim 38 wherein the decoding logic comprises a programmed ROM.

43. The memory module of claim 38 wherein the decoding logic comprises a set of range selection outputs, a pair of line decoding circuits and combinational logic, the line decoding circuits and combinational logic providing signals to the range selection outputs.

44. The memory module of claim 38 wherein the decoding logic comprises a combinational logic circuit.

45. An instruction decoding device for decoding an instruction indicating an operation to be performed on data in a storage array having a plurality of contiguous addressable storage locations, the device comprising first and second address input means, read/write control signal input means, instruction decoding logic, address range decoding logic, one or more instruction outputs arranged to indicate the operation to be performed and a plurality of address selection outputs, the instruction decoding logic being arranged to compare the first and second addresses and respective read/write control signals and to set the one or more instruction outputs depending upon the relative values of the address and control signals, the address range decoding logic being arranged to control the plurality of address selection outputs, there being one address selection output for each address in the storage array, the address range decoding logic being arranged to accept begin and end address codes as said first and second address inputs and to activate those address selection outputs corresponding to the first and second input addresses and each address between the first and second input addresses to select a range of storage locations bounded by the begin and end addresses which contain the data upon which the operation is to be performed.

46. The memory module of claim 45 wherein the decoding logic comprises a programmed ROM.

47. The memory module of claim 45 wherein the decoding logic comprises a set of range selection outputs, a pair of line decoding circuits and combinational logic, the line decoding circuits and combinational logic providing signals to the range selection outputs.

48. The memory module of claim 45 wherein the decoding logic comprises a combinational logic circuit.

* * * * *